United States Patent
Lee et al.

(10) Patent No.: US 7,470,573 B2
(45) Date of Patent: Dec. 30, 2008

(54) METHOD OF MAKING CMOS DEVICES ON STRAINED SILICON ON GLASS

(75) Inventors: Jong-Jan Lee, Camas, WA (US); Jer-Shen Maa, Vancouver, WA (US); Douglas J. Tweet, Camas, WA (US); Yoshi Ono, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 337 days.

(21) Appl. No.: 11/060,878

(22) Filed: Feb. 18, 2005

(65) Prior Publication Data

US 2006/0189111 A1 Aug. 24, 2006

(51) Int. Cl.
*H01L 21/30* (2006.01)
*H01L 21/84* (2006.01)

(52) U.S. Cl. ............... 438/154; 438/458; 257/E21.088

(58) Field of Classification Search ............... 438/597, 438/664, 149, 154, 164, 455, 458, 478–480; 257/E27.06, E21.087–E21.088, E21.532, 257/E21.535, E21.598
See application file for complete search history.

(56) References Cited

U.S. PATENT DOCUMENTS

| 6,277,679 | B1* | 8/2001 | Ohtani | 438/151 |
|---|---|---|---|---|
| 6,355,941 | B1* | 3/2002 | Yamazaki et al. | 257/66 |
| 6,524,935 | B1* | 2/2003 | Canaperi et al. | 438/478 |
| 6,689,646 | B1 | 2/2004 | Joshi et al. | |
| 6,777,761 | B2* | 8/2004 | Clevenger et al. | 257/388 |
| 6,784,037 | B2* | 8/2004 | Yamazaki et al. | 438/199 |
| 6,787,806 | B1* | 9/2004 | Yamazaki et al. | 257/64 |
| 2003/0227057 | A1* | 12/2003 | Lochtefeld et al. | 257/347 |
| 2004/0026765 | A1* | 2/2004 | Currie et al. | 257/616 |
| 2004/0229444 | A1* | 11/2004 | Couillard et al. | 438/455 |
| 2005/0020094 | A1* | 1/2005 | Forbes et al. | 438/784 |
| 2005/0095766 | A1* | 5/2005 | Yang | 438/197 |
| 2005/0253193 | A1* | 11/2005 | Chen et al. | 257/347 |
| 2006/0019464 | A1* | 1/2006 | Maa et al. | 438/458 |

OTHER PUBLICATIONS

Nishisaka, M. et al., "Application of plasma oxidation to strained-Si/SiGe MOSFET", Mat. Sci. in Semi. Processing 8 (2005) pp. 225-230.*

(Continued)

*Primary Examiner*—Douglas M Menz
*Assistant Examiner*—Matthew W Such
(74) *Attorney, Agent, or Firm*—Law Office of Gerald Maliszewski; Gerald Maliszewski

(57) ABSTRACT

A method of making CMOS devices on strained silicon on glass includes preparing a glass substrate, including forming a strained silicon layer on the glass substrate; forming a silicon oxide layer by plasma oxidation of the strained silicon layer; depositing a layer of doped polysilicon on the silicon oxide layer; forming a polysilicon gate; implanting ions to form a LDD structure; depositing and forming a spacer dielectric on the gate structure; implanting and activation ions to form source and drain structures; depositing a layer of metal film; annealing the layer of metal film to form salicide on the source, drain and gate structures; removing any unreacted metal film; depositing a layer of interlayer dielectric; and forming contact holes and metallizing.

7 Claims, 5 Drawing Sheets

OTHER PUBLICATIONS

Yang, T. et al., "Study of Nicel Silicide Contact on Si/Si1-xGex", IEEE Electron. Dev. Lett., vol. 24, No. 9, Sep. 2003 pp. 544-546.*

Bera, L.K., et al., "Oxidation of strained Si in a microwave electron cyclotron resonance plasma", Appl. Phys. Lett. 70 (2) 1997 pp. 217-219.*

Gambino, J. P.,et al., "Silicides and ohmic contacts", Materials Chemistry and Physics, 52 (1998) 99-146.*

Bera, L.K., et al. Appl. Phys. Lett. 70 (2), Jan. 13, 1997.*

Nishisaka, M., et al., Materials Science in Semiconductor Processing 8 (2005) 225-230.*

Yang, T., et al., IEEE Electron Device Letters, vol. 24, No. 9, Sep. 2003.*

Bright, A.A, et al. "Low-Rate Plasma Oxidation of Si in a Dilute Oxygen/Helium Plasma for Low-Temperature Gate Quality Si/SiO2 Interfaces." Applied Physics Letters. vol. 58, No. 6 (Feb. 11, 1991): pp. 619-621.*

Shi et al., *Characterization of Low-Temperature Processed Single-Crystalline Silicon Thin-Film Transistor on Glass*, IEEE Electron Device Letters, vol. 24, No. 9, pp. 574-576 (2003).

Tai et al., *Performance of Poly-Si TFTs fabricated by SELAX*, IEEE Trans. Electron Devices, vol. 51, No. 6, pp. 934-939 (2004).

Mizuki et al., *Large Domains of Continuous Grain Silicon on Glass Substrate for High-Performance TFTs*, IEEE Trans. Electron Devices, vol. 51, No. 2, pp. 204-211 (2004).

Walker et al., *Improved Off-Current and Subthreshold Slope in Aggressively Scaled Poly-Si TFTs With a Single Grain Boundary in the Channel*, IEEE Trans. Electron Devices, vol. 51, No. 2, pp. 212-219 (2004).

* cited by examiner

US 7,470,573 B2

METHOD OF MAKING CMOS DEVICES ON STRAINED SILICON ON GLASS

FIELD OF THE INVENTION

This invention relates to silicon-on-glass, for display and sensor applications, and particularly to the fabrication of TFTs on glass.

BACKGROUND OF THE INVENTION

Thin film transistors (TFTs) with better performance are required for incorporation into the next generation of mobile and high resolution displays because functional circuits, such as controller, drivers, and so on, will be integrated on the same substrate as the pixel array. The displays will require TFTs which have low power consumption, low threshold voltages, a steep subthreshold slope, and high carrier mobility. Although many researchers have focused on polysilicon TFTs to achieve these goals, Tai et al., *Performance of Poly-Si TFTs fabricated by SELAX*, IEEE Trans. Electron Devices, Vol. 51, No. 6, pp 934-939 (2004); and Mizuki et al., *Large Domains of Continuous Grain Silicon on Glass Substrate for High-Performance TFTs*, IEEE Trans. Electron Devices, Vol. 51, No. 2, pp 204-211 (2004), the common objective is to reduce the grain boundaries and hence improve the TFT performance; Walker et al., *Improved Off-Current and Subthreshold Slope in Aggressively Scaled Poly-Si TFTs With a Single Grain Boundary in the Channel*, IEEE Trans. Electron Devices, Vol. 51, No. 2, pp 212-219 (2004).

In order to alleviate the grain boundary problem all together, single crystalline silicon TFTs have been demonstrated, Shi et al., *Characterization of Low-Temperature Processed Single-Crystalline Silicon Thin-Film Transistor on Glass*, IEEE Electron Device Letters, Vol. 24, No. 9, pp 574-576 (2003). Single crystalline silicon layer on glass was obtained using an "ion-cutting" based layer transfer technique. A hydrogen implanted silicon wafer is first bond to a glass wafer. A thin silicon film is next exfoliated from the silicon wafer and transferred to glass wafer. The single crystalline silicon TFTs exhibited significantly higher electron mobility (~430 $cm^2$/V-sec), a steeper subthreshold slope and a lower leakage current that was also relatively insensitive to gate bias.

To further improve the TFT performance, TFTs fabricated on strained-silicon-on-glass (SSOG) wafer have been described by Maa et al., *Method of Making Silicon-on-Glass via Layer Transfer*, U.S. patent application Ser. No. 10/894,685, filed Jul. 20, 2004 (SLA.0864); and Maa et al., *Strained Silicon-on-Insulator from Film Transfer and Relaxation by Hydrogen Implantation*, U.S. patent application Ser. No. 10/755,615, filed Jan. 12, 2004 (SLA.0822). Strained silicon TFTs on glass demonstrated an effective electron mobility up to 850 $cm^2$/V-sec. The fabrication of SSOG wafer begins with a compressively-strained, thin SiGe layer deposition on a silicon wafer. The SiGe thickness is between about 200 nm to 400 nm, and has either a fixed or a graded composition. The SiGe relaxation is achieved by hydrogen implantation and subsequent thermal annealing. Strained silicon is deposited after CMP of the relaxed SiGe surface. Hydrogen splitting ion implantation is targeted deep into the silicon region, which is far from the strained silicon layer. In addition, the Si/SiGe interface helps to retard the propagation of defects and dislocations generated deep in the silicon region. The strained silicon-on-thin-SiGe virtual-substrate is bonded to a glass wafer. After splitting, SiGe is selectively removed, resulting in a strained silicon film, having a smooth surface, directly on glass.

Devices fabricated on SSOG wafer are similar to the devices fabricated on a silicon wafer, except that the process temperature is limited to a temperature below that of the glass transition temperature. Gate oxidation is by plasma oxidation, doped polysilicon deposition is performed to avoid polysilicon depletion issues, and NiSi is formed on the source, drain and gate to reduce the transistor series resistance, as described in U.S. Pat. No. 6,689,646 B1, granted Feb. 10, 2004, to Joshi et al., for *Plasma Method for Fabricating Oxide Thin Films*.

SUMMARY OF THE INVENTION

A method of making CMOS devices on strained silicon on glass includes preparing a glass substrate, including forming a strained silicon layer on the glass substrate; forming a silicon oxide layer by plasma oxidation of the strained silicon layer; depositing a layer of doped polysilicon on the silicon oxide layer; forming a polysilicon gate; implanting ions to form a LDD structure; depositing and forming a spacer dielectric on the gate structure; implanting and activating ions to form source and drain structures; depositing a layer of metal film; annealing the layer of metal film to form salicide on the source, drain and gate structures; removing any unreacted metal film; depositing a layer of interlayer dielectric; and forming contact holes and metallizing.

It is an object of the invention to fabricate CMOS devices on strained silicon on a glass substrate.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The purpose of this invention is to fabricate CMOS devices on strained silicon on a glass substrate. The strained silicon is first formed on a relaxed SiGe layer by hydrogen implantation induced relaxation. This film is then transferred to the glass substrate by direct wafer bonding and hydrogen induced exfoliation. Although part of the relaxed SiGe layer is also transferred to the glass substrate, because of a high etch selectivity between SiGe and silicon, a very smooth silicon layer, having a thickness of less than 50 nm, may easily be achieved. Plasma oxidation provides gate oxide growth at low temperature, and doped polysilicon deposition is provided to avoid polysilicon depletion issues, NiSi is formed on the source and drain regions and on the gate region to reduce the transistor series resistance, and are done as integrated processes. The method of the invention makes it possible to develop future advanced devices on glass substrates.

Instead of using an oxidized wafer, as in the prior art, strained-silicon-on-relaxed SiGe is bonded to a Corning 1737 glass wafer. The process, while similar to the SSOI process, which is the subject of U.S. patent application Ser. No. 10/755,615, supra, provides a more efficient fabrication method. The relaxed SiGe, after CMP, is between about 200 nm to 400 nm thick. Epitaxial silicon thickness varies from between about 10 nm to 50 nm. Hydrogen ion splitting implantation is performed at an energy of between about 100 keV to 250 keV, with a dose of between about 2E16 to 6E16. Surface treatment prior to bonding is similar to that described in the above-identified patent applications, which are incorporated herein by reference. Splitting is performed at a temperature of between about 300° C. to 500° C., for between about thirty minutes to five hours. After wafer split, the top silicon portion from the silicon substrate, and part of the SiGe, is removed by a dry etch step. Post dry etch anneal is performed at about 550° C. to improve the bonding strength. A final CMP is performed to remove the roughness from splitting. A final selective etch step is used to remove the remaining SiGe layer.

Figure 1:
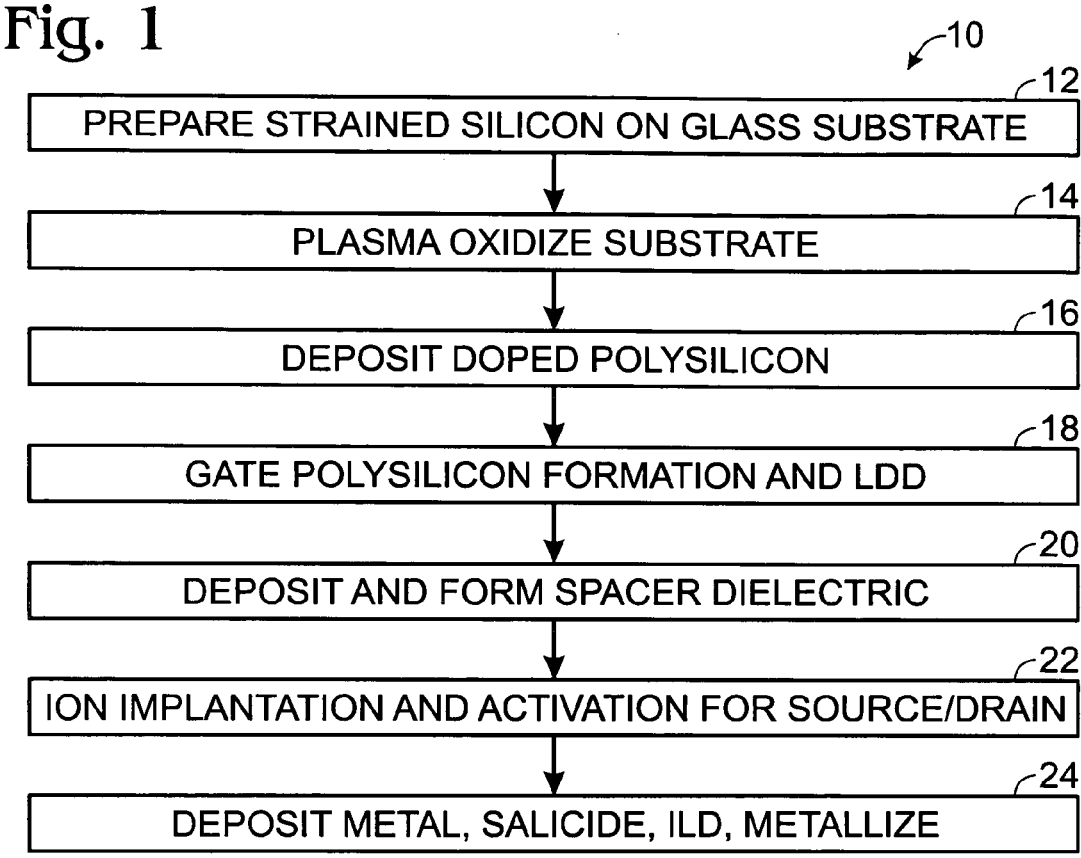
FIG. 1 is a block diagram of the method of the invention.

The method of the invention is depicted in FIG. 1, generally at 10, and includes preparation 12 of a glass substrate wafer is prepared, including transfer of a strained silicon layer onto the glass, wafer annealing at between about 550° C. to 650° C. for between about one hour to ten hours. The wafer is then plasma oxidized 14 at between about 300° C. to 600° C., in an helium/oxygen mixture, to form a silicon oxide layer, having a thickness of between about 20 Å to 500 Å. A layer of doped polysilicon, having either phosphorus or boron doping, is deposited 16 to a thickness of between about 500 Å to 4000 Å. A gate is formed 18, followed by LDD ion implantation. Spacer dielectric deposition and spacer formation are next performed 20, followed by source/drain ion implantation and activation 22. Nickel-salicide formation, ILD, contact hole formation, and metallization 24 complete this phase of the method of the invention.

Figure 2:
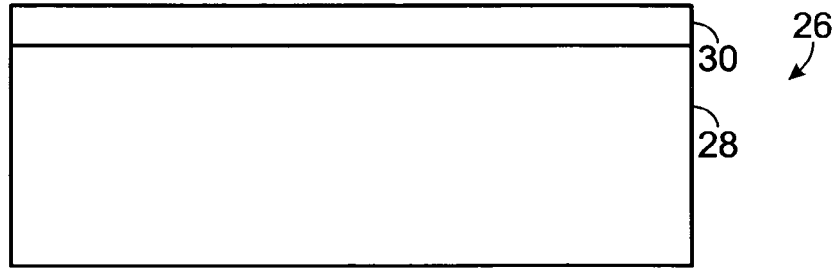
FIGS. 2-9 depict various steps in the method of the invention.

Referring now to FIGS. 1 and 2, a strained-silicon-on-glass (SSOG) wafer 26 is prepared 12, having a glass substrate 28 and a strained silicon layer 30 thereon having a thickness of between about 10 nm to 50 nm. A dielectric layer, e.g., $SiO_2$, $Si_3N_4$, or a combination thereof, may be deposited between the strained silicon layer and the glass to prevent the diffusion of any undesirable elements in the glass into the strained silicon. The SSOG wafer is annealed at between about 500° C. to 650° C. for between about one hour to ten hours, to remove the crystal defect due to hydrogen ion implantation, which was performed to produced the strained silicon layer prior to its transfer to the glass substrate, and to improve the bonding strength.

Figure 3:
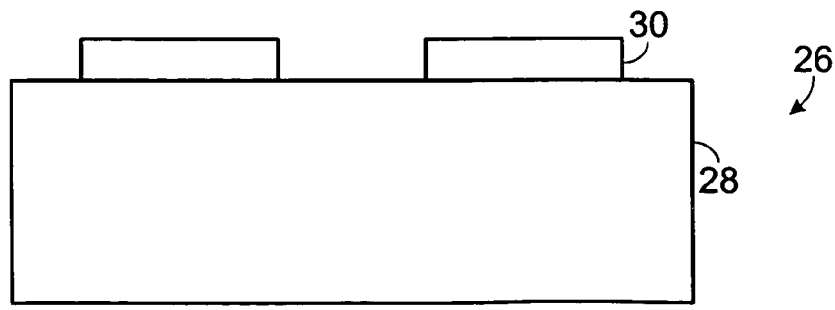

A mesa isolation step is performed, FIG. 3, removing a portion of strained silicon layer 30.

Figure 4:
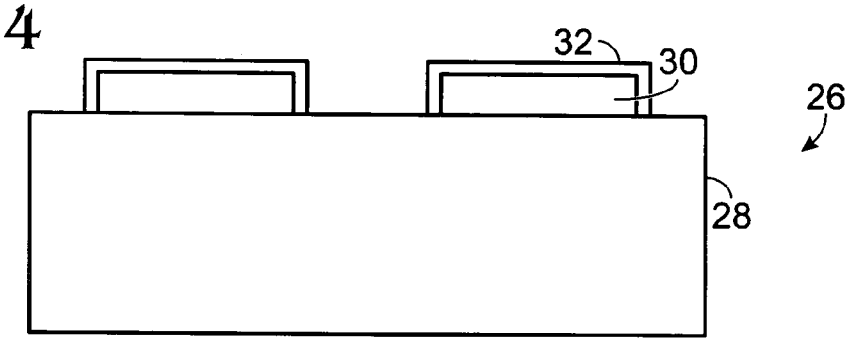

Moving to FIGS. 1 and 4, a gate oxidation by plasma oxidation process is performed, at a substrate temperature of between about 300° C. to 600° C., in an ambient atmosphere of $He/O_2$, resulting in a silicon oxide layer 32, having a thickness of between about 30 Å to 500 Å.

Figure 5:
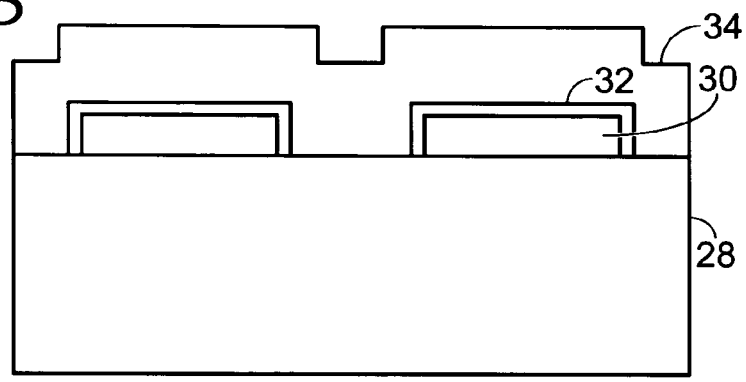

A layer 34 of doped polysilicon is deposited 16, as shown in FIG. 5, which may be either phosphorous-doped or boron-doped polysilicon, although the use of phosphorous-doped polysilicon is preferred, which is deposited to a thickness of between about 500 Å to 4000 Å, at a temperature of between about 450° C. to 650° C.

Figure 6:
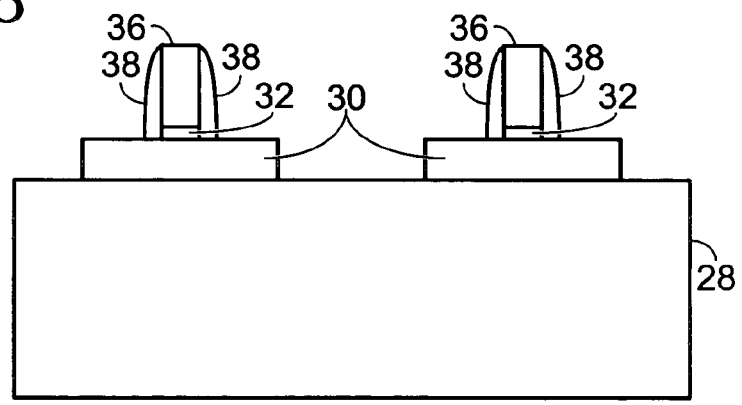

As shown in FIG. 6, a polysilicon gate 36 is formed, followed by LDD ion implantation 18. Spacer 38 deposition and formation follows, wherein the spacer material may be $SiO_2$, $Si_3N_4$, or a combination thereof. $Si_3N_4$ deposition is by a PECVD process to reduce the deposition temperature to between about 350° C. to 450° C.

Figure 7:
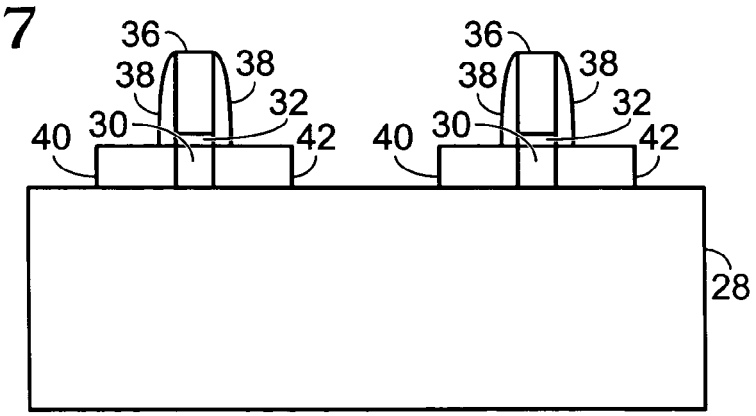

FIG. 7 depicts the structure following N+ and P+ ion implantation and activation 22 to form a source 40 and drain 42, respectively, wherein N+ ion implantation includes implantation of phosphorus ions at an energy of between about 10 keV to 100 keV, and a dose of between about $2 \times 10^{15}$ $cm^{-2}$ to $8 \times 10^{15}$ $cm^{-2}$; and P+ ion implantation includes implantation of boron ions at an energy of between about 10 keV to 100 keV, and a dose of between about $2 \times 10^{15}$ $cm^{-2}$ to $8 \times 10^{15}$ $cm^{-2}$. Ion activation requires between about one hour to 24 hours in a nitrogen or argon ambient atmosphere at a temperature of between about 500° C. to 650° C.

Figure 8:
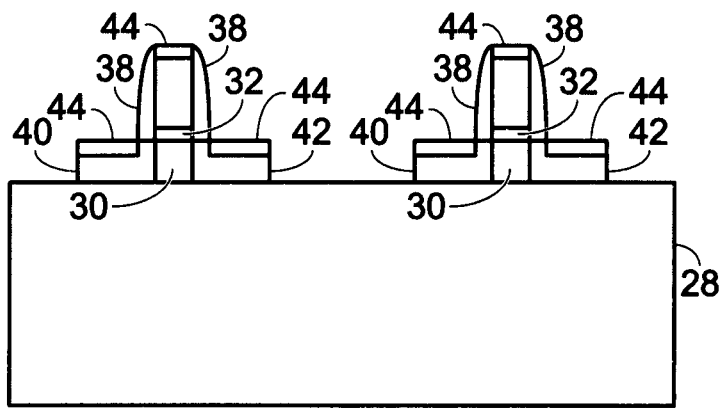

A nickel-salicide process to salicide the source, drain, and gate is depicted in FIG. 8, wherein a layer of nickel having a thickness of between about 50 Å to 200 Å is deposited. Subsequent annealing at between about 400° C. to 550° C. for between about 30 seconds to 30 minutes in a rapid thermal anneal (RTA) system, or in a regular furnace, with an inert ambient atmosphere, e.g., Ar or $N_2$, provides a layer of NiSi 44. Any unreacted nickel is removed by dipping in a mixture of $H_2SO_4/H_2O_2/H_2O$, or a mixture of $NH_4OH/H_2O_2/H_2O$.

Figure 9:
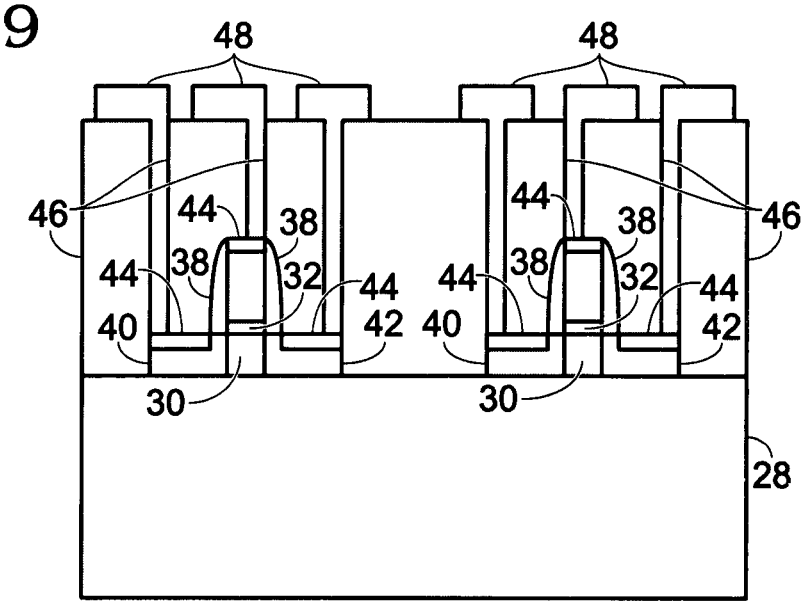

FIG. 9 depicts interlayer dielectric (ILD) 46 formation, contact hole formation, and metallization, resulting in contacts 48, all of which are performed by state-of-art IC process technology to finish the device fabrication.

Figure 10:
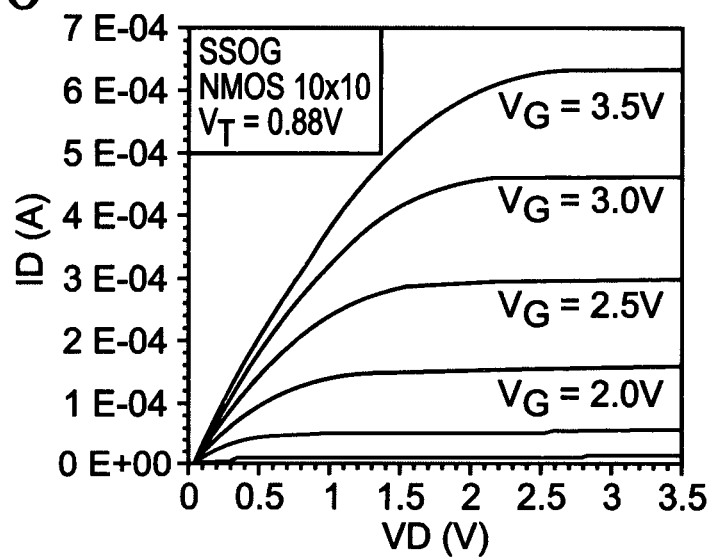
FIG. 10 depicts the IV characteristic of a W/L=10 μm/10 μm NMOS fabricated on a SSOG wafer.
Figure 11:
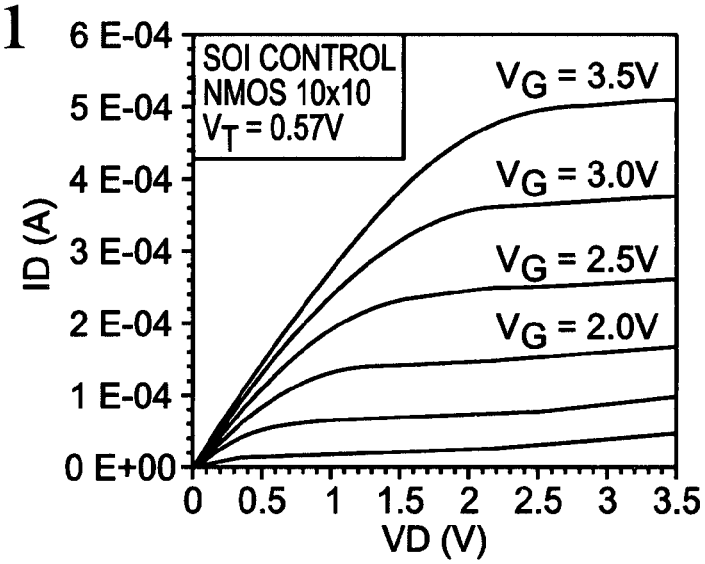
FIG. 11 depicts the IV characteristic of a W/L=10 μm/10 μm NMOS fabricated on a SOI wafer.
Figure 12:
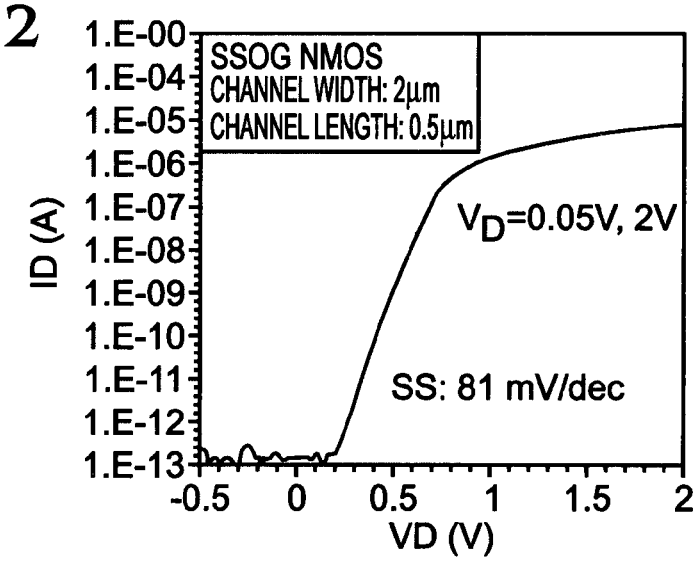
FIG. 12 depicts the subthreshold characteristic of a W/L=2 μm/0.5 μm NMOS device on SSOG.
Figure 13:
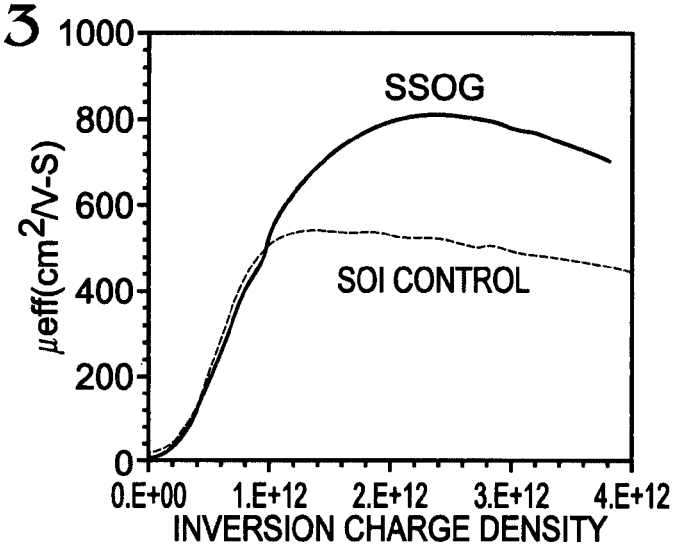
FIG. 13 depicts the effective electron mobility on device fabricated on SSOG and control SOI wafers.

NMOS devices are fabricated on SSOG wafer along with the SOI wafers as control. The IV characteristics of a W/L=10 μm/10 μm NMOS device on SSOG and SOI are shown in FIGS. 10 and 11, respectively, and the device on SSOG has higher drive current (ID(A)) than the one fabricated on SOI control. The subthreshold characteristic on NMOS device with channel width of 2 μm and channel length of 0.5 μm is shown in FIG. 12. The subthreshold swing is 81 mV/dec which is the smallest ever reported for a TFT on glass. The peak of effective electron mobility on SSOG and SOI are 850 and 560 cm2/V-sec, respectively, as shown in FIG. 13. The effective mobility of 850 cm2/V-sec is the highest mobility ever reported for a TFT on glass. These extreme results are directly attributable to the method of the invention for forming a CMOS TFT on glass.

Figure 14:
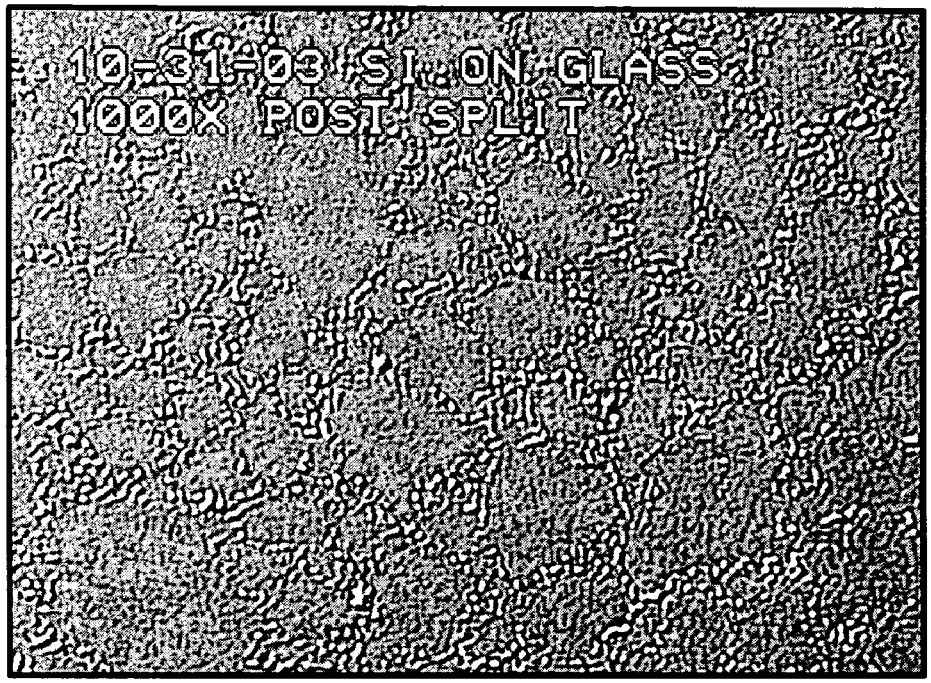
FIG. 14 depicts strained Si/SiGe/Si on glass after splitting.
Figure 15:
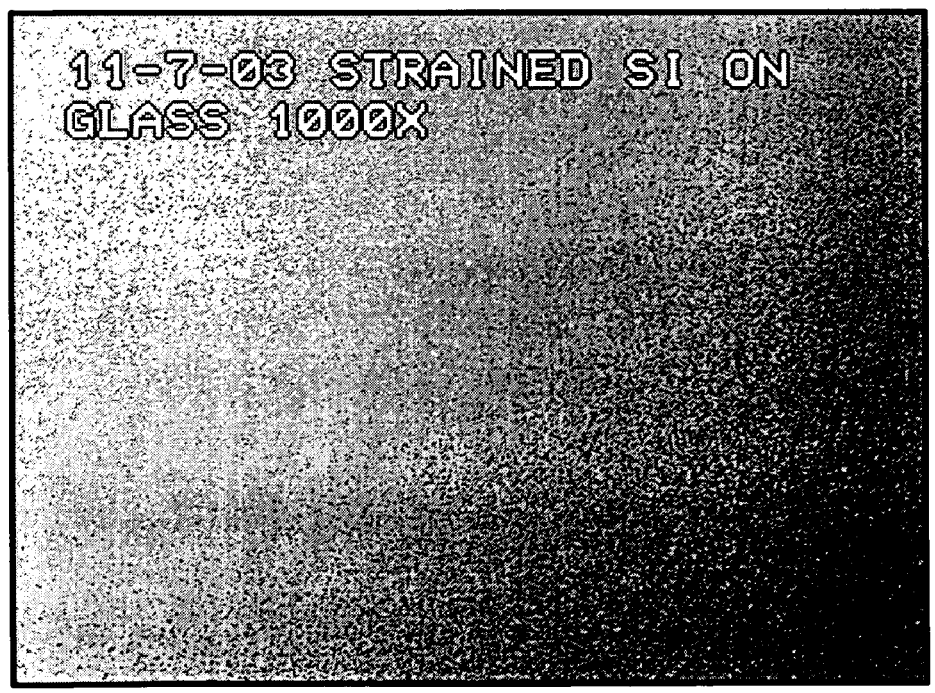
FIG. 15 depicts strained silicon on glass after the final selective etch step.

FIGS. 14 and 15 compare the surface feature immediately after splitting and after the final selective etch, respectively, wherein the strained silicon has a thickness of about 35 nm. The silicon was under 0.80% biaxial strain. Tensile strain is equivalent to SiGe substrate, which is 100% relaxed with 21% germanium.

The method of the invention may be used to fabricate a strained-silicon-on-glass substrate, wherein selective removal of SiGe provides a smooth strained silicon-on-glass surface. CMOS devices may be fabricated on strained-silicon-on-glass wafer according to the method of the invention. Plasma oxidation techniques may be used to grow the gate oxide at low temperature. Doped polysilicon may be used for gate formation, preferably, phosphorus doped polysilicon is used so that the NMOS is the surface channel device and PMOS is the buried channel device. NiSi may be used to reduce source/drain series resistance.

Thus, a method of making CMOS devices on strained silicon on glass has been disclosed. It will be appreciated that further variations and modifications thereof may be made within the scope of the invention as defined in the appended claims.

We claim:

1. A method of making CMOS devices on strained silicon on glass, comprising:
    preparing a glass substrate, including forming a strained silicon layer directly adjacent to, and in physical contact with the glass substate as follows:
    forming the strained silicon layer on a relaxed silicon/germanium (SiGe) layer;
    bonding the SiGe layer to the glass substrate:
    implanting hydrogen into the SiGe layer;
    inducing exfoliation in a hydrogen-rich region of the SiGe layer, creating a SiGe/strained silicon/glass substrate structure; and,
    etching the SiGe layer overlying the strained silicon layer;
    forming a silicon oxide layer by plasma oxidation of the strained silicon layer;
    depositing a layer of doped polysilicon on the silicon oxide layer;
    forming a polysilicon gate structure;
    implanting ions into the strained silicon layer forming a LDD structure in a first ion implanting process;
    depositing and forming a spacer dielectric on the polysilicon gate structure;
    implanting and activating ions into the strained silicon layer forming source and drain structures in a second ion implantation process;
    depositing a layer of metal film overlying the source, drain, and polysilicon gate structures;
    annealing the layer of metal film overlying the source, drain, and polysilicon gate structures forming salicide on the source, drain, and polysilicon gate structures;
    removing metal film unreacted with the source, drain, and polysilicon gate structures;
    conformally depositing a layer of interlayer dielectric; and
    forming contact holes overlying the source, drain, and polysilicon gate structures, and metallizing the contact holes.

2. The method of claim 1 wherein said preparing a glass substrate includes annealing the glass substrate and the strained silicon layer at a temperature of between about 550° C. to 650° C. for between about one hour to ten hours.

3. The method of claim 1 wherein said forming a silicon oxide layer by plasma oxidation of the strained silicon layer includes plasma oxidizing the strained silicon layer at a temperature of between about 300° C. to 600° C. in a mixture of helium and oxygen forming a silicon oxide layer having a thickness of between about 20 Å to 500 Å.

4. The method of claim 1 wherein said depositing a layer of doped polysilicon includes depositing a layer of polysilicon to a thickness of between about 500 Å to 4000 Å, at a temperature of between about 450° C. to 650° C., and doping the layer of polysilicon with phosphorus.

5. The method of claim 1 wherein said depositing and forming a spacer dielectric on the polysilicon gate structure includes depositing a layer of material selected from the group of materials consisting of $SiO_2$, $Si_3N_4$ and a combination thereof.

6. The method of claim 1 wherein said implanting and activation ions into the strained silicon layer forming source and drain structures in a second ion implantation process includes forming a N+ region by implantation of phosphorus ions into the strained silicon layer at an energy of between about 10 keV to 100 keV, and a dose of between about $2\times10^{15}$ $cm^{-2}$ to $8\times10^{15}$ $cm^{-2}$; and forming a P+ region by implantation of boron ions into the strained silicon layer at an energy of between about 10 keV to 100 keV, and a dose of between about $2\times10^{15}$ $cm^{-2}$ to $8\times10^{15}$ $cm^{-2}$, and which further includes ion activation for between about one hour to 24 hours in a nitrogen ambient atmosphere at a temperature of between about 500° C. to 650° C.

7. The method of claim 1 wherein said depositing a layer of metal film overlying the source, drain, and polysilicon gate structures includes depositing a layer of nickel film overlying the source, drain and polysilicon gate structures on the source, drain,and polysilicon gate structures, having a thickness of between about 50 Å to 200 Å; and wherein said annealing the layer of metal film overlying the source, drain ,and polysilicon gate structures includes annealing at between about 400° C. to 550° C. for between about 30 seconds to 30 minutes in an inert ambient atmosphere, and removing metal film unreacted with the source, drain, and polysilicon gate structure includes removing nickek film unreacted with the source, drain, and polysilicon gate structures by dipping in a mixture selected from the group of mixtures including $H_2SO_4/H_2O_2/H_2O$ and $NH_4OH/H_2O_2/H_2O$.

* * * * *